(12) United States Patent
Kwan

(10) Patent No.: US 7,081,945 B2
(45) Date of Patent: Jul. 25, 2006

(54) DEVICE MANUFACTURING METHOD, DEVICE MANUFACTURED THEREBY AND LITHOGRAPHIC APPARATUS THEREFOR

(75) Inventor: Yim Bun Patrick Kwan, Aalen (DE)

(73) Assignee: ASML Netherlands B.V., Veldhoven (NL)

( * ) Notice: Subject to any disclaimer, the term of this patent is extended or adjusted under 35 U.S.C. 154(b) by 158 days.

(21) Appl. No.: 10/321,847

(22) Filed: Dec. 18, 2002

(65) Prior Publication Data

US 2003/0198787 A1    Oct. 23, 2003

(30) Foreign Application Priority Data

Dec. 21, 2001   (EP)   ................... 01310847

(51) Int. Cl.
  *G03B 27/42*    (2006.01)
  *G03B 27/62*    (2006.01)

(52) U.S. Cl. .......................... 355/53; 355/75
(58) Field of Classification Search ................. 355/52, 355/53, 55, 67, 77; 430/20, 22, 30; 250/548
See application file for complete search history.

(56) References Cited

U.S. PATENT DOCUMENTS

| | | | |
|---|---|---|---|
| 4,758,863 A * | 7/1988 | Nikkel | 355/40 |
| 4,878,086 A * | 10/1989 | Isohata et al. | 355/77 |
| 4,980,718 A * | 12/1990 | Salter et al. | 355/53 |
| 5,815,247 A | 9/1998 | Poschenrieder et al. | |
| 5,821,034 A | 10/1998 | Kim et al. | |
| 5,832,620 A | 11/1998 | Yamaguchi et al. | |
| 5,933,219 A | 8/1999 | Unno | |
| 6,251,564 B1 | 6/2001 | Lin et al. | |
| 6,327,022 B1 | 12/2001 | Nishi | |
| 6,590,636 B1 | 7/2003 | Nishi | |
| 6,628,372 B1 * | 9/2003 | McCullough et al. | 355/75 |
| 6,671,035 B1 | 12/2003 | Eurlings et al. | |
| 6,780,574 B1 | 8/2004 | Kawashima | |
| 2001/0036604 A1 | 11/2001 | Kawashima | |

FOREIGN PATENT DOCUMENTS

| | | |
|---|---|---|
| EP | 0 855 623 A2 | 7/1998 |
| EP | 0 951 054 A1 | 10/1999 |
| EP | 1 041 443 A2 | 10/2000 |
| EP | 1 091 252 A2 | 4/2001 |
| JP | 2000021715 A | 1/2000 |

OTHER PUBLICATIONS

English translation of Japanese Patent document 2000-21715.*

* cited by examiner

*Primary Examiner*—Alan Mathews
(74) *Attorney, Agent, or Firm*—Pillsbury Winthrop Shaw Pittman, LLP

(57) ABSTRACT

A device manufacturing method includes performing field-by-field multiple exposure. In this way, each target portion (or field) of a substrate can be irradiated while maintaining high overlay accuracy. Optionally, when each target portion is exposed in the same manner, a high reproducibility of the feature sizes on the substrate can be secured. Further, a mask table holds a plurality of masks that are arranged side-by-side in a direction substantially perpendicular to a scan direction. Such an arrangement enables field-by-field multiple exposure without a throughput loss.

23 Claims, 2 Drawing Sheets

DEVICE MANUFACTURING METHOD, DEVICE MANUFACTURED THEREBY AND LITHOGRAPHIC APPARATUS THEREFOR

This application claims priority to European Application 01310847.7, filed Dec. 21, 2001, the entire contents of which are incorporated herein by reference.

BACKGROUND OF THE INVENTION

1. Field of the Invention

The present invention relates to a lithographic projection apparatus, a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the radiation beam in a given reference direction (the "scanning" direction) while synchronously scanning the substrate table parallel or anti-parallel to this direction. Since, in general, the projection system will have a magnification factor M (generally <1), the speed V ax which the substrate table is scanned will be a factor M times that at which the mask table is scanned. More information with regard to lithographic devices as here described can be seen, for example, from U.S. Pat. No. 6,046,791.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In lithography, it has become important to project smaller features or lines of a pattern on the patterning device onto the substrate. One way to reduce the size of the features is to use radiation having shorter wavelengths than currently available on commercially available lithographic apparatus. Another way to reduce the feature size is to employ extension technology such as multiple exposure in combination with, for example, dipole illumination. By using dipole illumination, only features in a specific orientation are projected onto the substrate with an accuracy that is relatively greater compared to the accuracy obtained using conventional illumination modes like for example, annular or quadrupole.

As exposure with dipole illumination generally leads to smaller features only in one orientation, the pattern of the patterning device must be split up into two patterns. Generally these patterns are put on two patterning devices, whereby a first patterning device only includes features in a first direction, e.g. a horizontal direction, and a second patterning device includes features extending in a second direction substantially perpendicular to the first direction, e.g. a vertical direction. Both horizontal and vertical directions reside in the plane of the pattern. By first projecting the horizontal features and subsequently projecting the vertical features, the overall feature size will be smaller compared to an exposure of the entire pattern (including horizontal and vertical features) with conventional illumination modes like annular or quadrupole illumination, for example.

In between exposing the first and the second patterns, the first and second patterning devices must be exchanged, which consumes time and reduces throughput. In order to decrease throughput reduction, it is generally preferred to expose a whole batch (comprising two or more substrates) with the first patterning device and then expose the same batch with the second patterning device. The advantage is that the first and second patterning device only need exchanging twice per entire batch. Hence, these two exchanges are shared by the whole batch of substrates.

Another method is to expose a first substrate with the first patterning device and subsequently expose the same substrate with the second patterning device before exposing a second substrate. In such case, the patterning devices are exchanged twice for each substrate which, of course, results in throughput loss relative to exchanging patterning devices twice per entire batch. In U.S. Pat. No. 6,327,022, it is proposed to put two masks on one mask table, whereby the masks are arranged in line along a scan direction. The scan direction is the direction along which a pattern on a mask is scanned by the projection beam during exposure of a substrate. By using such an arrangement, each target portion on the entire substrate is exposed with the pattern on the first mask, and, subsequently, each target portion is exposed with the pattern on the second mask. As both the first and the second mask are situated on one mask table, exchange of a mask is performed much quicker compared to mask exchange with mask tables comprising only a single mask. Hence, the time needed to perform the mask exchange is reduced and throughput is gained.

In the above-presented methods for multiple exposure, the time between the first and the second exposure is relatively long as at least one entire substrate is exposed with the first patterning device before exposure proceeds with the second patterning device. Consequently, the temperature of the substrate may be different during exposure of the first and second patterning devices due to, for example, temperature variations in an environment surrounding the substrate, for example a surrounding gas or the substrate table. As temperature variations may causes expansion or contraction of the substrate, the position of the projected pattern of the second patterning device with respect to the projected pattern of the first patterning device on the substrate, also called overlay, may drift. The extent of drift can be defined by overlay accuracy. A large drift results in a low overlay accuracy and vice versa. Temperature variations of the substrate between exposure of the first and the second patterning devices may lead to a low overlay accuracy which is, of course, highly undesirable.

SUMMARY OF THE INVENTION

It is an aspect of the present invention to provide a device manufacturing method for multiple exposure, with which an improved overlay accuracy is established.

This and other aspects are achieved according to a device manufacturing method including providing a beam of radiation using a radiation system; providing first and second patterning devices which are held on a support; using one of the first and second patterning devices in endow the beam of radiation with a pattern in its cross-section; projecting the patterned beam of radiation onto a target portion of a layer of radiation-sensitive material at least partially covering a substrate; projecting a first pattern on the first patterning device onto the target portion; and subsequently projecting a second pattern on the second patterning device onto the same target portion.

With such a method, a target portion is exposed with both patterning devices before exposing another target portion. Consequently, the time between projection of the first and the second pattern onto the target portion is minimized. By minimizing the time between the first and second exposure, the influence of temperature variations of the substrate is also reduced. Hence, the drift between the position of features projected during the first and second exposure is reduced and overlay accuracy is improved.

It is further preferable to expose the first and second mask in the same sequence on each target portion. As a dissimilar exposure sequence may introduce differences in feature size or overlay problems due to the intrinsic property of the radiation-sensitive layer, the reproducibility of the pattern on each target portion is enhanced by irradiating each target portion according to the same sequence.

It is further preferable to employ a support which is able to hold two patterning devices. Both patterning devices on the support are arranged side-by-side in a direction substantially perpendicular to the scan direction. With this arrangement, it is possible to perform a method including decelerating the support in the scan direction following projection of the first pattern; accelerating the support in the direction opposite to the scan direction prior to projection of the second pattern; and displacing the support in a direction substantially perpendicular to the scan direction during decelerating and/or accelerating the support such that the second pattern is positioned in line with the direction opposite to the scan direction.

With the above method, after exposure of the first pattern, the support moves such that the second pattern can be exposed immediately after the first exposure. In conventional lithographic apparatus with only one patterning device, the pattern on the patterning device is exposed onto the target portion while scanning the pattern with a certain constant speed. After exposure, the support decelerates, stops and accelerates to the speed in order to expose the pattern onto another target portion but now in a direction opposite to the scan direction. In the method of the present invention, the support is displaced in a direction perpendicular to the scan direction while deceleration and/or acceleration proceeds, thereby enabling exposure of the second pattern immediately after the acceleration. In this way, there is no extra time needed to exchange a patterning device as deceleration and acceleration must be performed anyway. Above all, this method provides a way to perform multiple exposure with high overlay accuracy and without any throughput loss.

According to a further aspect of the invention there is provided a lithographic projection apparatus including a radiation system constructed and arranged to provide a beam of radiation; a support constructed and arranged to support at least two patterning devices, the patterning devices constructed and arranged to pattern the beam of radiation according to a desired pattern; a substrate table constructed and arranged to hold a substrate; a projection system constructed and arranged to project the patterned beam onto a target portion of the substrate, wherein the patterning devices on the support are arranged side-by-side in a direction substantially perpendicular to a scan direction.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle" or "mask", "wafer" or "die" in this text should be considered as being replaced by the more general terms "patterning device", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only with reference to the accompanying schematic drawings in which.

In the Figures, corresponding reference symbols indicate corresponding parts.

DETAILED DESCRIPTION

Figure 1:
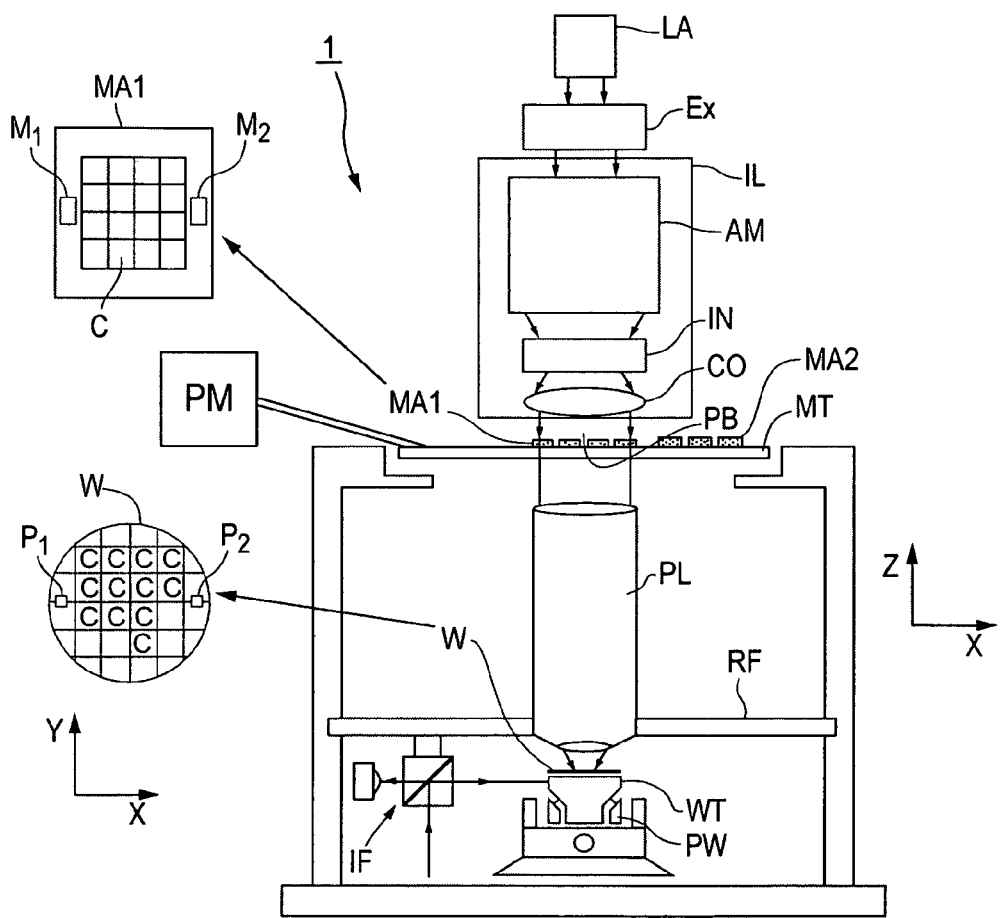
FIG. 1 depicts a lithographic projection apparatus.

FIG. 1 schematically depicts a lithographic projection apparatus 1 according to an embodiment of the invention. The apparatus includes a radiation system Ex, IL that supplies a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder for holding masks MA1 and MA2 (e.g. a reticle), and connected to a first positioning device PM to accurately position the masks MA1 and MA2 with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system or lens PL is supported on a reference frame RF. As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompass embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts a mask MA1 or MA2, which is held on the mask table MT. Having traversed the mask MA1 or MA2, the beam PB passes through the projection system or lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA1 or MA2 and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by die beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
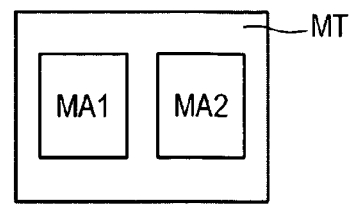
FIG. 2 depicts a mask table provided with two masks according to an embodiment of the present invention.

FIG. 2 shows the mask table MT constructed and arranged to hold the first and second masks MA1 and MA2. The mask table MT can be employed for multiple exposure purposes. If a dipole illumination setting is used, only features in a particular direction, e.g. a horizontal or vertical direction, can be imaged with a smaller feature size, i.e. a smaller critical dimension. In general, the horizontal and vertical features of a pattern to be projected are separated on the masks MA1 and MA2.

The horizontal and vertical features must then be exposed in two exposure steps. In multiple exposure methods, the overlay of the features on the different masks and the reproducibility of the critical dimension of these features on the substrate are important. To this end, both masks MA1 and MA2 must be projected one immediately after the other on the target portion (or field) before exposing a subsequent target portion. This method may also be referred to as field-by-field double exposure.

Figure 3:
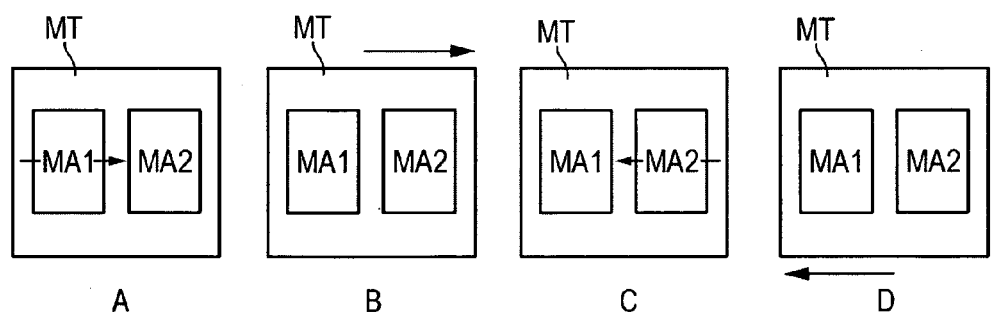
FIG. 3 schematically shows a first method for multiple exposure according to an embodiment of the present invention.

In the step-and-scan apparatus, the steps taken during the double exposure must be carefully chosen in order to accommodate a field-by-field double exposure method having a relatively high overlay accuracy. One method is schematically depicted in FIG. 3. In A, mask MA1 (which is at rest) is first accelerated to a desired velocity. When reaching the required constant velocity, the mask MA1 is exposed and projected onto a first target portion on the substrate W. The direction of movement of the mask table MT is referred to as the scan direction. After exposing the first mask MA1, the mask table MT continues to move with the same velocity and passes the second mask MA2, whereafter the table MT decelerates and stops completely. This is indicated by an arrow in B. In C the mask table MT first accelerates to the desired velocity and, subsequently, at this velocity the second mask MA2 is irradiated in a direction opposite to the scan direction. The pattern on the second mask MA2 is projected onto the same target portion as previously irradiated in A. Following exposure of the second mask MA2, the mask table MT continues to move at constant velocity and passes the first mask MA1 analogous to B. After passing the first mask MA1, the mask table MT decelerates and stops. Then, A to D can be repeated on a second target portion.

In the meantime, while B proceeds at mask level, the substrate table WT (shown in FIG. 1) just decelerates and stops. Thereafter, the first target portion on the substrate is irradiated backwards concurrently and synchronously with C. During D the substrate table WT decelerates and stops, after which it moves to a desired position from which the second target portion is irradiated according to the above cycle.

As the overlay accuracy also depends on the positioning accuracy of either the mask or the substrate, movement of both mask and substrate may introduce positioning errors. The positioning errors on the substrate level are generally relatively larger as positioning errors on the mask level are scaled down on the substrate level by the magnification of the projection lens, which may typically be ¼ or ⅕. In other words, movement of the substrate table WT must be performed four or five times more accurately than movement of the mask table MT. Therefore, it is preferable to minimize the number and extent of movements at the substrate level. The above-described method enables minimal movement of the substrate, hence introducing only relatively small overlay errors.

With the described method, it is evident that the exchange from the first mask MA1 to the second mask MA2 (or vice versa) takes time as movement of the mask table in B and D requires additional time compared to conventional repeated exposure of just one mask. This inevitably leads to a throughput loss. In another embodiment described below each target portion is irradiated with two masks without any throughput loss.

Figure 4:
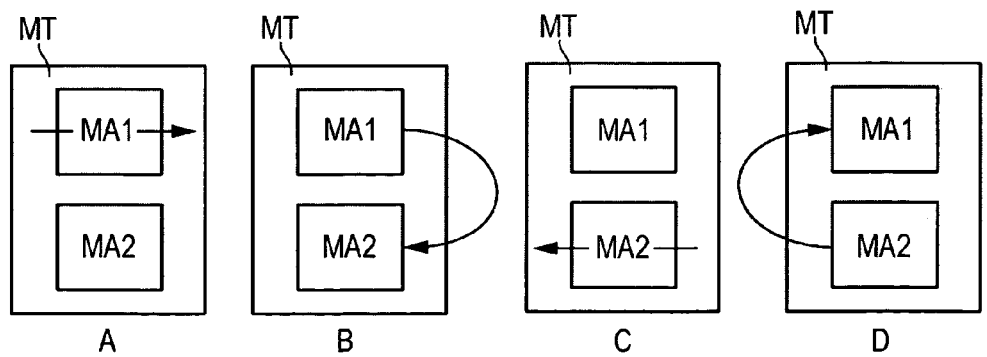
FIG. 4 schematically shows a second method for multiple exposure according to an embodiment of the present invention.

A second embodiment of the present invention is schematically shown in FIG. 4. In this case, the first and second masks MA1 and MA2, which are held on mask table MT, are arranged side-by-side in a direction substantially perpendicular to the scan direction. In this way, it becomes possible to perform B different from B of the first embodiment. As the mask table MT is decelerating directly after exposure of the first mask MA1, the mask table MT concurrently moves to the second mask MA2 (downward movement in FIG. 4). The movement to the second mask MA2 is continued in order to reach the desired position from which the second mask MA2 can be irradiated and projected onto the target portion. The desired position (prior to exposure of the second mask MA2) must be reached before the mask table MT is accelerated to the required velocity for exposure (in a direction opposite to the scan direction). The above movement is schematically indicated by the arrow in B of FIG. 4. Analogously, D is performed to enable positioning of the mask table so as to allow immediate exposure of the first mask MA1 as soon as the mask table accelerates to the required constant velocity.

Displacement of the mask table in a direction substantially perpendicular to the scan direction may proceed at any stage during deceleration or acceleration in the scan direction. The displacement may start and be finished during deceleration or it may start and be finished during acceleration. Most preferable is that the displacement starts during deceleration and ends during acceleration of the mask table, since in this way unnecessary and undesirable shock or vibrations exerted on the mask table due to fast acceleration or fast deceleration during this displacement are minimized.

As movement to the right position for exposure of the second mask MA2 takes place simultaneously with deceleration and acceleration of the table MT, no additional time is needed for exchanging a mask compared to conventional repeated exposure of just one mask pattern. Consequently, a high throughput is maintained.

Although in the above only mask tables comprising two masks are described, it should be appreciated that the mask table may comprise a plurality of masks or that the mask table comprises a relatively large mask comprising at least two patterns which may be similar in size to a pattern on one of the first and second masks.

While specific embodiments of the invention have been described above, it will be appreciated that the invention may be practiced otherwise than as described. The description is not intended to limit the invention.

What is claimed is:

1. A device manufacturing method, comprising:
   providing a beam of radiation using a radiation system;
   providing first and second patterning devices which are held on a support, the first patterning device comprising features only in a first direction and the second patterning device comprising features only in a second direction substantially perpendicular to the first direction;
   using one of the first and second patterning devices to endow the beam of radiation with a pattern in its cross-section;
   projecting the patterned beam of radiation onto a target portion of a layer of radiation-sensitive material at least partially covering a substrate;
   projecting a first pattern on the first patterning device onto the target portion;
   subsequently projecting a second pattern on the second patterning device onto the same target portion before projecting one of the first and second patterns onto another target portion;
   projecting the first pattern while scanning the first pattern in a scan direction; and
   subsequently projecting the second pattern while scanning the second pattern in a direction opposite to the scan direction.

2. A method according to claim 1 further comprising:
   arranging the first and second patterning devices on the support side-by-side in a direction substantially perpendicular to the scan direction.

3. A method according to claim 2, further comprising:
   displacing the support in a direction substantially perpendicular to the scan direction between the projecting the first pattern and projecting the second pattern.

4. A method according to claim 2, further comprising:
   decelerating the support in the scan direction following projection of the first pattern;
   accelerating the support in the direction opposite to the scan direction prior to projection of the second pattern; and
   displacing the support structure in a direction substantially perpendicular to the scan direction, during at least one of decelerating and accelerating the support structure such that the second pattern is positioned in line with the direction opposite to the scan direction.

5. A method according to claim 1, wherein the radiation system provides dipole illumination.

6. A device manufacturing method, comprising:
   providing a beam of radiation using a radiation system;
   providing a patterning device, which is held on a support, having a first pattern and a second pattern, the first pattern comprising features only in a first direction and the second pattern comprising features only in a second direction substantially perpendicular to the first direction;
   using the patterning device to endow the projection beam with one of the first and second patterns in its cross-section;
   projecting the patterned beam of radiation onto a target portion of a layer of radiation-sensitive material at least partially covering a substrate;
   projecting the first pattern on the patterning device onto the target portion;
   subsequently projecting the second pattern on the patterning device onto the same target portion before projecting one of the first and second patterns onto another target portion;
   projecting the first pattern while scanning the first pattern in a scan direction; and
   subsequently projecting the second pattern while scanning the second pattern in a direction opposite to the scan direction.

7. A method according to claim 6, further comprising:
   arranging the first and second patterns on the support side-by-side in a direction substantially perpendicular to the scan direction.

8. A method according to claim 7, further comprising:
   displacing the support in a direction substantially perpendicular to the scan direction between the projecting the first pattern and projecting the second pattern.

9. A method according to claim 7, further comprising:
   decelerating the support in the scan direction following projection of the first pattern;
   accelerating the support in the direction opposite to the scan direction prior to projection of the second pattern; and
   displacing the support in a direction substantially perpendicular to the scan direction, during at least one of decelerating and accelerating the support, such that the second pattern is positioned in line with the direction opposite to the scan direction.

10. A method according to claim 6, wherein the radiation system provides dipole illumination.

11. A lithographic projection apparatus, comprising:
    a radiation system constructed and arranged to provide a beam of radiation;

a support constructed and arranged to support at least two patterning devices, the patterning devices serving to pattern the beam of radiation according to a desired pattern;

a substrate table constructed and arranged to hold a substrate; and a projection system constructed and arranged to project the patterned beam onto a target portion, wherein the apparatus is constructed and arranged to project a first pattern on the first patterning device that comprises features extending only in a first direction onto the target portion and subsequently project a second pattern on the second patterning device that comprises features extending only in a second direction substantially perpendicular to the first direction onto the same target portion before projection of one of the first and second patterns onto another target portion, and the apparatus is constructed and arranged to project the first pattern while scanning the first pattern in a scan direction and subsequently to project the second pattern while scanning the second pattern in a direction opposite to the scan direction.

12. Apparatus according to claim 11, wherein the first and second patterning device on the support are arranged side-by-side in a direction substantially perpendicular to the scan direction.

13. Apparatus according to claim 12, wherein the apparatus is constructed and arranged to displace the support in a direction substantially perpendicular to the scan direction between the projection of the first pattern and projection of the second pattern.

14. Apparatus according to claim 12, further comprising:
a first positioning device constructed and arranged to decelerate the support in the scan direction following projection of the first pattern;
a second positioning device constructed and arranged to accelerate the support in the direction opposite to the scan direction prior to projection of the second pattern, wherein the apparatus is constructed and arranged to displace the support in a direction substantially perpendicular to the scan direction, during at least one of deceleration and acceleration of the support, such that the second pattern is positioned in line with the direction opposite to the scan direction.

15. Apparatus according to claim 11, wherein the radiation system provides dipole illumination.

16. A lithographic projection apparatus, comprising:
a radiation system constructed and arranged to provide a beam of radiation;
a support constructed and arranged to support a patterning device having a first pattern and a second pattern, the first pattern comprising features only in a first direction and the second pattern comprising features only in a second direction substantially perpendicular to the first direction, the patterning device constructed and arranged to pattern the beam of radiation according to a desired pattern;
a substrate table constructed and arranged to hold a substrate and
a projection system constructed and arranged to project the patterned beam onto a target portion of the substrate, wherein the apparatus is constructed and arranged to project the first pattern on the patterning device onto the target portion and the apparatus is constructed and arranged to subsequently project the second pattern on the patterning device onto the same target portion before projection of one of the first and second patterns onto another target portion, and the apparatus is constructed and arranged to project the first pattern while scanning the first pattern in a scan direction and subsequently to project the second pattern while scanning the second pattern in a direction opposite to the scan direction.

17. Apparatus according to claim 16, wherein the first and second patterns on the support are arranged side-by-side in a direction substantially perpendicular to the scan direction.

18. Apparatus according to claim 17, wherein the apparatus is constructed and arranged to displace the support in a direction substantially perpendicular to the scan direction between the projection of the first pattern and projection of the second pattern.

19. Apparatus according to claim 17, further comprising:
a first positioning device constructed and arranged to decelerate the support in the scan direction following projection of the first pattern;
a second positioning device constructed and arranged to accelerate the support in the direction opposite to the scan direction prior to projection of the second pattern; and
wherein the apparatus is constructed and arranged to displace the support structure in a direction substantially perpendicular to the scan direction, during at least one of deceleration and acceleration of the support structure, such that the second pattern is positioned in line with the direction opposite to the scan direction.

20. Apparatus according to claim 16, wherein the radiation system provides dipole illumination.

21. A lithographic projection apparatus, comprising:
a radiation system constructed and arranged to provide a beam of radiation;
a support constructed and arranged to support at least two patterning devices, the patterning devices serving to pattern the beam of radiation according to a desired pattern;
a substrate table constructed and arranged to hold a substrate;
a projection system constructed and arranged to project the patterned beam onto a target portion of the substrate, wherein the patterning devices on the support are arranged side-by-side in a direction substantially perpendicular to a scan direction;
a first positioning device constructed and arranged to decelerate the support in the scan direction following projection of the first pattern; and
a second positioning device constructed and arranged to accelerate the support in the direction opposite to the scan direction prior to projection of the second pattern, wherein the apparatus is constructed and arranged to displace the support structure in a direction substantially perpendicular to the scan direction, during at least one of deceleration and acceleration of the support, such that the second pattern is positioned in line with the direction opposite to the scan direction.

22. Apparatus according to claim 21, wherein the apparatus is constructed and arranged to project the first pattern while scanning the first pattern in a scan direction and subsequently to project the second pattern while scanning the second pattern in a direction opposite to the scan direction.

23. Apparatus according to claim 21, wherein the apparatus is constructed and arranged to displace the support in a direction substantially perpendicular to the scan direction between the projection of the first pattern and projection of the second pattern.

* * * * *